United States Patent [19]

Kurtz et al.

[11] Patent Number: 5,112,725
[45] Date of Patent: May 12, 1992

[54] PREPARATION OF RECORDING LAYERS AND THEIR USE FOR THE PRODUCTION OF FLEXOGRAPHIC PRINTING PLATES

[75] Inventors: Karl-Rudolf Kurtz, Heidelberg; Horst Koch, Gruenstadt; Guenther Schulz, Ludwigshafen, all of Fed. Rep. of Germany

[73] Assignee: BASF Aktiengesellschaft, Ludwigshafen, Fed. Rep. of Germany

[21] Appl. No.: 668,337

[22] Filed: Mar. 14, 1991

Related U.S. Application Data

[63] Continuation of Ser. No. 428,040, Oct. 26, 1989, abandoned, which is a continuation of Ser. No. 90,749, Aug. 28, 1987, abandoned.

[30] Foreign Application Priority Data

Sep. 6, 1986 [DE] Fed. Rep. of Germany ....... 3630474

[51] Int. Cl.⁵ .............................................. G03F 7/16
[52] U.S. Cl. ..................... 430/306; 430/309; 430/325; 430/328; 430/286; 430/282; 430/327
[58] Field of Search ............... 430/306, 309, 325, 328, 430/286, 282, 30, 327

[56] References Cited

U.S. PATENT DOCUMENTS

| | | | |
|---|---|---|---|
| 3,990,897 | 11/1976 | Zuerger et al. | 96/67 |
| 4,038,078 | 7/1977 | Sakurai et al. | 96/35.1 |
| 4,045,231 | 8/1977 | Toda et al. | 96/115 P |
| 4,046,577 | 9/1977 | Muzyczko et al. | 96/115 R |
| 4,162,919 | 7/1979 | Richter et al. | 96/87 R |
| 4,197,130 | 4/1980 | Nakamura et al. | 430/286 |
| 4,272,608 | 6/1981 | Proskow | 430/288 |
| 4,320,188 | 3/1982 | Heinz et al. | 430/281 |
| 4,373,102 | 11/1984 | Neumann et al. | 430/58 |
| 4,400,460 | 8/1983 | Fickes et al. | 430/306 |
| 4,481,272 | 2/1983 | Eckell et al. | 430/10 |
| 4,517,278 | 5/1985 | Sakurai | 430/306 X |

FOREIGN PATENT DOCUMENTS

| | | |
|---|---|---|
| 0017132 | 3/1980 | European Pat. Off. |
| 0064564 | 11/1982 | European Pat. Off. |
| 0061094 | 12/1982 | European Pat. Off. |
| 1358062 | 6/1974 | United Kingdom |
| 1366769 | 9/1974 | United Kingdom |
| 1395822 | 5/1975 | United Kingdom |
| 1525965 | 9/1978 | United Kingdom |

*Primary Examiner*—Cynthia Hamilton
*Attorney, Agent, or Firm*—Keil & Weinkauf

[57] ABSTRACT

A flexographic printing plate which is resistant to ozone cracking and where the flexible recording layer has an anisotropy factor AF of <1.5 is produced from a photosensitive mixture consisting of A) one or more elastomeric binders, B) a mixture of
  B1) from 5 to 20% by weight of one or more photopolymerizable organic compounds which are compatible with (A) and contain two or more olefinic double bonds and
  B2) from 1 to 15% by weight of one or more monoolefinically unsaturated organic compounds which are compatible with (A) and whose homopolymer has a glass transition temperature which is below room temperature,
C) from 0.1 to 10% by weight of one or more photoinitiators and
D) from 0 to 27% by weight of conventional assistants and additives, the anisotropy factor AF of the flexible recording layer being defined as the ratio of the moduli of elasticity at 100% elongation of strips measuring 2×15 cm which have been punched from the flexible recording layer during production of the raw plate, on the one hand along the flow direction of the photosensitive mixture used and on the other hand crosswise to the said direction and have then been exposed uniformly.

9 Claims, No Drawings

PREPARATION OF RECORDING LAYERS AND THEIR USE FOR THE PRODUCTION OF FLEXOGRAPHIC PRINTING PLATES

This application is a continuation of application Ser. No. 428,040, filed on Oct. 26, 1989, now abandoned, which is a continuation of application Ser. No. 090,749, filed on Aug. 28, 1987, now abandoned.

The present invention relates to a process for the preparation of flexible recording layers which can be developed with organic solvents and mixtures of these, and the use of the flexible recording layers for the production of flexographic printing plates.

Photopolymer layers and their use for the production of printing plates for flexographic printing are known and are described in, for example, EP 64 564, DE-B-22 15 090, DE-A-24 56 439, DE-A-29 42 183, DE-A-21 38 582 and DE-A-24 44 118. Such photopolymer layers for flexographic printing plates generally contain elastomeric binders, one or more compatible photopolymerizable monomers, plasticizing components, photoinitiators and other assistants and additives.

On photocrosslinking, the monomers produce a differentiation in solubilities, so that, after imagewise exposure, the unexposed parts of the flexographic printing plate can be washed out with solvents in which the binder and nonpolymerized monomers are soluble or swellable.

The disadvantage of this is that the exposed plates become brittle when extended and during storage. This embrittlement leads to a deterioration in the mechanical properties and to greater susceptibility to flexographic printing inks and the ozone content of the air. Consequently, the usefulness of such printing plates is considerably restricted.

In order to improve the mechanical properties, plasticizing fillers are added to the plates, the said fillers ensuring that the printing plate has the required flexibility even after exposure. Such plasticizers are usually saturated, long-chain alkanes or esters of aromatic dicarboxylic acids. They have the disadvantage that they may be extracted by solvents as required for developing the printing plate, or may diffuse to the surface of the flexographic printing plate in the course of time and exude from there. This once again causes a deterioration in the mechanical properties of the printing plates during development and storage. Moreover, particularly where fairly large amounts of plasticizer are used, damage to the relief occurs during the development process, especially in brush washers. The same applies in principle to the waxes used to increase the ozone protection.

DE-A-29 42 183 has already disclosed photopolymerizable mixtures and elements produced from these, which contain a) not less than 40% by weight of one or more elastomeric block copolymers which are soluble in a developer and have a thermoplastic nonelastomeric polymer block A and an elastomeric diene polymer block B, b) not less than 1% by weight of one or more photopolymerizable olefinically unsaturated monomers which are compatible with the block copolymer (a), and c) from 0.1 to 10% by weight of one or more photopolymerization initiators, the block copolymer (a) being an elastomeric block copolymer having the structure A-B-C, and a1) the polymer block A which accounts for 5–25% by weight of the block copolymer is prepared from one or more of the styrene monomers of the formula $CH_2=CRR'$, where R is hydrogen or methyl and R' is phenyl or $C_1-C_4$-alkyl-substituted phenyl, and has a glass transition temperature greater than $+25°$ C., a2) the polymer block B which accounts for 15–90% by weight of the block copolymer is prepared from one or more aliphatic diene hydrocarbons of 4 or 5 carbon atoms and has a glass transition temperature of less then $-20°$ C., and a3) the polymer block C which accounts for 5–60% by weight of the block copolymer is prepared by homopolymerization of copolymerization of one or more diene hydrocarbons of 4 or 5 carbon atoms and has a glass transition temperature of from $-30°$ C. to $+15°$ C.

Examples of photopolymerizable olefinically unsaturated monomers which are used here in amounts of from 1 to 40% by weight are esters of acrylic acid and/or methacrylic acid with monohydric or polyhydric alcohols, such as butyl (meth)acrylate, 2-ethylhexyl acrylate, lauryl (meth)acrylate, ethylene glycol dimethacrylate, butane-1,4-diol di(meth)acrylate, etc., and mixtures of these monomers. These mixtures can be converted to layers by pressing, extrusion and calendering. However, the plates obtained from these mixtures often possess insufficient isotropy, which may adversely affect the print result.

It is an object of the present invention to prepare very isotropic flexible recording layers and to convert these to flexographic printing plates or plates having improved cohesion properties, the said plates showing no tendency to embrittlement during printing and being more stable to printing inks and to the ozone content of the environment.

We have found, surprisingly, that this object is achieved by the proportionate use of certain amounts of photopolymerizable, monoolefinically unsaturated organic compounds which are compatible with the elastomeric binder.

The present invention relates to a process for the preparation of flexible recording layers, which can be developed with organic solvents or mixtures of these and give printing plates having an anisotropy factor of <1.5 and improved ozone crack resistance, from a photosensitive mixture of (A) one or more elastomeric binders, (B) a mixture of two or more nongaseous, photopolymerizable, olefinically unsaturated organic compounds which are compatible with (A), and (C) one or more photoinitiators, with or without (D) other conventional assistants and additives, the mixture of the components (A) to (D) being applied to a base and subjected to processing steps which produce preferred directions, wherein a mixture of from 5 to 20% by weight (B1) of one or more photopolymerizable organic compounds which are compatible with (A) and contain two or more olefinic double bonds, and from 1 to 15% by weight (B2) of one or more monoolefinically unsaturated, photopolymerizable organic compounds which are compatible with (A) and whose homopolymers have a glass transition temperature which is below room temperature is used as component (B), the percentages by weight in each case being based on the total amount of the photosensitive mixture (A) to (D).

Esters of acrylic acid with branched monoalkanols of 4 to 16 carbon atoms, in particular 2-ethylhexyl acrylate, esters of acrylic acid with straight-chain monoalkanols of 6 to 12 carbon atoms, amides of acrylic acid with alkylamines of 4 to 16 carbon atoms, or vinyl alkyl ethers where alkyl is of 4 to 18 carbon atoms are preferably used as component (B2).

The present invention furthermore relates to the use of the novel flexible recording layers for the production of flexographic printing plates.

The composition of the monomer mixture (B), in particular the amount of nongaseous, monoolefinically unsaturated photopolymerizable organic compounds which are compatible with (A) and whose homopolymers have glass transition temperatures below room temperature is of critical importance. If they are present in an amount of less than 1% by weight, anisotropic printing plates and relief damage during washout result, whereas an amount of more than 15% by weight results in excessive plastic flow of the unexposed layer. An amount of from 2 to 10, in particular from 2 to 8, % by weight, based on the total amount of photosensitive mixture, of component (B2) is preferred.

By the novel proportionate use of monoolefinically unsaturated, photopolymerizable organic compounds which are compatible with (A) and whose homopolymers have glass transition temperatures below room temperature (about 22° C.), it is possible, surprisingly, to produce isotropic printing plates and polymerized printing plates and to improve the mechanical properties of the printing plates. Under identical conditions, for example during the development process in the brush washer, printing plates of this type give rise to less fragmentation of relief parts than those from the abovementioned Patents.

Surprisingly, it was also found that the addition, according to the invention, of the monomers (B2) furthermore improved the ozone resistance of flexographic printing plates compared with those containing inert plasticizers.

From the conventional coating processes, in which the mixtures of components (A) to (D) are applied to a dimensionally stable base and subjected to processing steps producing preferred directions, for example extrusion or calendering or lamination processes, it is known that flexographic printing plates produce different dot and line widths during printing, depending on the flow direction. This result is reinforced by a higher monomer content (B1) in the formulation. Surprisingly, by the novel use of the monomers (B2), particularly the abovementioned acrylates, the anisotropic printing behavior is substantially reduced.

If more monomer (B1) is added to the mixtures described in the abovementioned Patents, the result has as adverse effect on the exposure latitude. The latter is the time between the exposure time required for satisfactorily anchoring a screen having a line width of 50 μm and a layer thickness of from 700 to 3,000 μm and the exposure time when a negative i dot of 400 μm diameter still has a depth of not less than 70 μm. However, if the monomers (B2) are added to the mixture, the desired advantageous exposure latitude is surprisingly retained, despite the higher monomer content in this case.

Another advantage is the fact that shorter exposure times are sufficient for the imagewise exposure of plates produced according to the invention compared with the exposure times for the known photopolymer layers.

Regarding the components of the photosensitive mixture for the novel process, the following may be stated specifically.

(A) For the purpose of the present invention, elastomeric binders (A) are conventional elastomeric polymers, polyadducts and polycondensates, for example homopolymers of butadiene or isoprene, copolymers of butadiene with isoprene, copolymers of butadiene and/or isoprene with other copolymerizable olefinically unsaturated organic compounds, such as vinylaromatics, e.g. styrene, 2-methylstyrene or vinyltoluene, nitriles and/or esters of acrylic and/or methacrylic acid, such as acrylonitrile, methacrylonitrile and esters of (meth)acrylic acid with alkanols of 1 to 8 carbon atoms.

Examples of suitable elastomeric binders are elastomeric block copolymers of the type A-B-A as described in, for example, DE-A-22 15 090, DE-A-22 23 808, DE-A-28 15 678 and DE-A-26 10 206.

Preferred elastomeric binders (A) are those which have a Shore A hardness of from 20 to 80.

Particularly preferred elastomeric binders are block copolymers of type ABC, as described in DE-A-29 42 183. In these block copolymers, for example, A is a thermoplastic, nonresilient styrene polymer, B is an elastomeric butadiene and/or isoprene polymer and C is a polymer which differs from B and consists of butadiene and/or isoprene and, if appropriate, styrene.

Component (A) is generally used in amounts of from 60 to 93% by weight, based on the total amount of the photosensitive mixture (A) to (D).

(B) Component (B) is a mixture of from 5 to 20% by weight (B1) of one or more photopolymerizable organic compounds which are compatible with (A) and contain two or more olefinic double bonds and from 1 to 15% by weight (B2) of one or more monoolefinically unsaturated photopolymerizable organic compounds which are compatible with (A) and whose homopolymer has a glass transition temperature which is below room temperature.

Examples of component (B1) are the conventional (meth)acrylates of polyhydric alcohols, e.g. ethylene glycol dimethacrylate, butane-1,4-diol diacrylate, butane-1,4-diol dimethacrylate, neopentylglycol dimethacrylate, 3-methylpentanediol diacrylate, hexanediol diacrylate, hexane-1,6-diol dimethacrylate, 1,1,1-trimethylolpropane triacrylate and trimethacrylate, di-, tri- and tetraethylene glycol diacrylate, tripropylene glycol diacrylate and pentaerythritol tetraacrylate, as well as mixtures of these. Suitable monomers of this type are also described in DE-A-30 12 841.

components (B1) is used in an amount of from 5 to 20, preferably from 7 to 15, % by weight, based on the total amount of the photosensitive mixture (A) to (D).

Examples of component (B2), i.e. monofunctional photopolymerizable monomers which are compatible with component (A) and whose homopolymers have glass transition temperatures below room temperature are appropriate esters of acrylic and methacrylic acid, such as n-butyl acrylate, isobutyl acrylate, preferably esters of acrylic acid with branched monoalkanols of 4 to 16 carbon atoms such as ®Alfol-6,10-acrylate, ®Cadura-E-10-acrylate and 2-ethylhexyl acrylate, and straight-chain monoalkanols of 6 to 12 carbon atoms, such as lauryl acrylate. ®Alfol-6,10-acrylate from Shell Aktiengesellschaft is an ester obtained by oligomerization of ethylene, introduction of an OH group into the ethylene oligomer and esterification with acrylic acid. °Cadura-E-10-acrylate from Shell Aktiengesellschaft is a tert-alkanecarboxylic acid whose alkyl radical has a acrylate group as a substituent.

Amides of acrylic acid with an alkylamine of 4 to 16 carbon atoms, preferably N-octylacrylamide, and vinyl alkyl ethers where alkyl is of 4 to 18 carbon atoms, e.g.

butyl vinyl ether and hexyl vinyl ether and mixtures of the monomers stated under (B2) are also suitable.

Other useful monomers whose homopolymers have a glass transition temperature below room temperature are listed in Polymer Handbook, 2nd Edition, J. Wiley & Sons, N.Y. 1979.

The content of such monomers (B2) in the photosensitive mixture of components (A) to (D) is from 1 to 15, preferably from 2 to 10, in particular from 2 to 8, % by weight, based on the total amount of the photosensitive mixture (A) to (D).

(C) Suitable photoinitiators are the conventional ones, for example benzoin ethers, benzophenones, thioxanthones, ketals, such as benzil dimethyl ketal, acetophenones and acylphosphine oxides. Suitable photoinitiators of this type are also described in the above-mentioned publications. Benzil dimethyl ketal and trimethylbenzoyldiphenylphosphine oxide are preferred.

The photoinitiators are used in the photosensitive mixture of components (A) to (D) in general in amounts from 0.01 to 10, preferably from 0.01 to 5, % by weight.

(D) Other assistants and additives which may also be present are thermal polymerization inhibitors, dyes, pigments, antihalation agents, fluxes, photochromic substances, antiozonants and antioxidants, mold release agents, plasticizers, fillers and/or reinforcing fillers, in effective amounts.

Particularly preferred plasticizers are chloroalkanes of 8 to 40 carbon atoms which contain from 30 to 73% by weight of chlorine and, for example, can be incorporated into the photosensitive mixtures in amounts of up to 20% by weight.

For example, oligomer α-methylstyrene/vinyltoluene copolymers with $\overline{M}_n$ of about 1500 or oligomers based on polystyrene and with $\overline{M}_n$ of from 500 to 10,000 may be present as processing assistants and for regulating the hardness.

A suitable heat stabilizer is, for example, 2,6-di-(tert-butyl)-phenol or the corresponding cresol.

Ozone-protection waxes (e.g. Antilux ® 550) and dyes, e.g. dye SSBB (Sudan deep black) and Cu phthalocyanines may also be used.

The photosensitive mixture of components (A) to (D) can be converted to homogeneous, sheet-like structures having a layer thickness of from 10 to 8,000 μm by a conventional technique, such as kneading in a Brabender apparatus, extrusion and subsequent calendering or casting from toluene solution. Suitable bases for such layers are dimensionally stable bases, for example steel, plastic films, aluminum, nickel or other polymeric bases which may also be flexible. Flexographic printing plates are produced by the conventional processing method, for example preexposure, principal imagewise exposure, development in an organic solvent, preferably perchloroethylene/n-butanol, drying, treatment to impart freedom from tack, and postexposure.

In the Examples which follow, parts and percentages are by weight, unless stated otherwise.

EXAMPLE 1 TO 5

Preparation of extruded layers:

The elastomeric binder (A) was introduced uniformly into a twin-screw extruder via a conveying screw and melted at 140° C. The liquid components (monomers (B1) and (B2), the photoinitiator and the dye) were pumped in succession into the extruder, and the product was extruded through a slot die. Using a calender, 2,900 μm recording layers were prepared between a 125 μm polyester film and a nylon substrate.

TABLE 1

Preparation of flexible recording layers using photosensitive mixtures of the following compositions:

| Example no. | (A) % | (B1) % | (B2) type | % | Photo-initiator % | Dye % | Heat stabilizer % | Ozone protection wax % | α-methyl-styrene/ vinyl-toluene copolymer ($M_n$ 500) % |
|---|---|---|---|---|---|---|---|---|---|
| 1 | 82 | 6 | ® Alfol-6.10-acrylate[a] | 6 | 1 | 0.005 | 1 | 1 | 3 |
| 2 | 82 | 6 | Isobutyl acrylate | 6 | 1 | 0.005 | 1 | 1 | 3 |
| 3 | 82 | 6 | 2-ethyl-hexyl acrylate | 6 | 1 | 0.005 | 1 | 1 | 3 |
| 4 | 82 | 6 | Lauryl acrylate | 6 | 1 | 0.005 | 1 | 1 | 3 |
| 5 | 82 | 6 | ® Cadura-E-10-acrylate[a] | 6 | 1 | 0.005 | 1 | 1 | 3 |

(B1) = Monomer mixture of 4% of HDA2 + 2% of HDMA2
Photoinitiator = benzil dimethyl ketal
Dye = dye SSBB = Sudan deep black
Heat stabilizer = 2,6-di-(tert-butyl)-cresol
Ozone protection wax (Antiflux 550)
(A) = block copolymer, ABC (see description in DE-A-29 42 183)
HDA2 = hexanediol acrylate
HDMA2 = hexanediol dimethacrylate
[a]Producer: Shell Aktiengesellschaft.

The layers obtained were preexposed uniformly through the polyester film in a tubular exposure unit, exposed imagewise through a negative placed on the substrate layer and then developed in a brush washer for 6 minutes with a 4:1 perchloroethylene/n-butanol mixture. The flexographic printing plate was dried for 1 hour at 65° C., left to stand for 15 minutes, then subjected to a treatment with aqueous bromine solution to achieve freedom from tack and postexposed for 10 minutes. The resulting plates were satisfactory and gave excellent print results on printing cylinders.

Cast layers

Photosensitive layers having the composition listed in Table 2 were prepared by dissolving the corresponding components in toluene and applying the 30% strength solution to a 125 μm thick polyester film provided with a polyurethane adhesion-promoting layer. After drying, a 1000 μm thick layer was obtained. This layer was laminated with a 75 μm thick cover sheet, the film was removed and the layer was exposed through a negative and through the substrate remaining on the surface. After development as described above, a relief image which had a depth of 700 μm and corresponded to the transparent areas of the negative was obtained.

TABLE 2

Preparation of photosensitive layers by casting

| Example no. | (A) % | (B1) % | (B2) type | % | Photo-initiator % | Dye % | Heat stabilizer % | α-methyl-styrene/ vinyl-toluene copolymer ($M_n$ 1500) % |
|---|---|---|---|---|---|---|---|---|
| 6 | 80 | 7.0 | ® Alfol-6,10-acrylate[a] | 6 | 1.5 | 0.005 | 1.5 | 4 |
| 7 | 80 | 7.0 | Isobutyl acrylate | 6 | 1.5 | 0.005 | 1.5 | 4 |
| 8 | 80 | 7.0 | 2-Ethylhexyl acrylate | 6 | 1.5 | 0.005 | 1.5 | 4 |
| 9 | 80 | 7.0 | Lauryl acrylate | 6 | 1.5 | 0.005 | 1.5 | 4 |
| 10 | 80 | 7.0 | ® Cadura-E-10-acrylate[a] | 6 | 1.5 | 0.005 | 1.5 | 4 |

[a]Producer: Shell Aktiengesellschaft

The individual components were dissolved in toluene (final concentration 30%); for further data, see Table 1.

The plates thus obtained gave excellent print results.

EXAMPLE 11

A casting solution was prepared similarly to Example 8 and was cast on a 240 μm thick steel plate. After drying of the layer (thickness 700 μm) and development by a conventional method, plates were obtained in which the relief image corresponded to the exposed parts of the layer. The property profile is similar to that of the layers described in Example 8.

elapsed before the first cracks appeared was noted. The results are contained in Table 3.

An anisotropy factor AF was also defined with the aid of uniformly exposed strips which measured 2×15 cm and had been punched longitudinally or crosswise with respect to the direction of flow during production of the raw plate:

$$AF = \frac{\text{Modulus of elasticity (100\% elongation) along the flow direction}}{\text{Modulus of elasticity (100\% elongation) crosswise to the flow direction}}$$

The lower exposure limit (LEL) was also stated. This is the minimum time for which the layer must be exposed to actinic light in order sufficiently to anchor a screen having 50 μm wide lines.

Another column states the extraction losses up to 24 hours as a result of storage in 7:3 ethanol/ethyl acetate.

The severity of the damage to the relief under identical washout conditions is shown in the final column.

TABLE 3

Ozone resistance and anisotropy behavior of flexographic printing plates

| Example no. | Plasticizer or with (B2) | Freedom from cracks minutes | AF | LEL[a] minutes | Extr. loss % | Relief fragment. 50 m screen |
|---|---|---|---|---|---|---|
| Comparative Example 1 | White oil S 5000 | <10 | 1.6 | 22 | 4.56 | — |
| 1 | ® Alfol-6,10-acrylate[b] | 30–40 | 1.4 | 14 | 2.73 | + |
| 2 | Isobutyl acrylate | 30–40 | 1.3 | 14 | 2.44 | + |
| 3 | 2-Ethylhexyl acrylate | 50–60 | 1.1 | 16 | 2.71 | + |
| 4 | Lauryl acrylate | 20–30 | 1.4 | 18 | 3.07 | o |
| 5 | ® Cadura-E-10-acrylate[a] | <19 h | 1.4 | 18 | 2.86 | o |

[a]LEL: Lower exposure limit (50 μm screen line)
Relief fragmentation on screen elements of 50 μm line width,
Rating: — poor, o little, + good
[b]Producer: Shell Aktiengesellschaft

COMPARATIVE EXAMPLE 1

A photosensitive layer was prepared similarly to Example 1 by extrusion; in this layer, the monomer (B2) was replaced by the inert plasticizer white oil S5000. The layer obtained in this manner was investigated in respect of its ozone resistance and its anisotropy behavior. For this purpose, uniformly exposed strips measuring 2×10 cm and elongated by 10% were exposed to an ozone concentration of 50 pphm, and the time which

COMPARATIVE EXAMPLE 2

A photosensitive layer was prepared by casting similarly to Example 6; in this layer, the monomer (B2) was replaced by the inert plasticizer white oil S5000. The lower exposure limit of such a layer was compared with the lower exposure limits of the corresponding plates containing various monomers (B2) (cf. Table 4).

TABLE 4

Exposure properties of flexible, photosensitive layers containing inert plasticizers or various monomers (B2)

| Example no. | Plasticizer | LEL minutes |
|---|---|---|
| Comparative Example 2 | White oil S 5000 | 18 |
| 6 | ®Alfol-6,10-acrylate[a] | 14 |
| 7 | Isobutyl acrylate | 12 |
| 8 | 2-Ethylhexyl acrylate | 14 |
| 9 | Lauryl acrylate | 16 |
| 10 | ®Cadura-E-10-acrylate[a] | 14 |

[a]Producer Shell Aktiengesellschaft

EXAMPLE 14

The following components were mixed with the aid of an extruder and flexible, photosensitive layers having a thickness of 2,900 μm were produced, the preparation procedure being similar to that described under C):
75% of (A),
4% of hexanediol diacrylate (B1),
2% of hexanediol dimethacrylate (B1),
3% of trimethylolpropanetriacrylate (B1),
3% of isobutyl acrylate (B2),
9% of a chloroalkane mixture (8 to 40 carbon atoms; 49% Cl content; viscosity about 10,000 mPa.s at 25° C.),
1.5% of benzil dimethyl ketal,
1% of heat stabilizer (as in Table 1),
1.5% of ozone-protection wax and
0.005% of dye SSBB (Sudan deep black).

After lamination with a 125 μm base film and application of a substrate, the plates were exposed imagewise through a negative and blocks were produced by a conventional method.

The flexographic printing plates produced in this manner possessed high ozone resistance, an advantageous exposure latitude and short exposure times.

EXAMPLE 15

A mixture of 69 parts of the block copolymer ABC stated in Example 1, 12.9 parts of the chloroalkane-based plasticizer stated in Example 14, 6.7 parts of hexanediol diacrylate, 3.3 parts of hexanediol dimethacrylate, 1.0 part of the heat stabilizer stated in Example 1, 1.2 parts of trimethylbenzoyldiphenylphosphine oxide, 0.006 part of a Cu phthalocyanine dye (Sicoflush H green 8730), 1.0 part of ozone protection wax, 2.5 parts of 2-ethylhexyl acrylate and 2.5 parts of the α-methylstyrene/vinyltoluene copolymers stated in Example 1 ($M_n$ 1500) was extruded as described in Example 1. The resulting photopolymerized layer had an anisotropy factor (100%) AF of 1.0.

COMPARATIVE EXAMPLE 3

A mixture which differed from that of Example 15 only in that, instead of 2.5 parts of 2-ethylhexyl acrylate and 2.5 parts of the α-methylstyrene/vinyltoluene copolymer ($\overline{M}_n$ 1500), 5.0 parts of the α-methylstyrene/vinyltoluene copolymer were used (i.e. no monomer (B2) was added) was extruded as described in Example 1. The resulting photopolymerized layer had an anisotropy factor (100%) AF of 2.4. Blocks produced from this layer exhibited unsatisfactory printing behavior.

We claim:

1. A process for the production of a flexographic printing plate which is resistant to ozone cracking and where the flexographic printing plate has a flexible recording layer which has an anisotropy factor AF of less than 1.5, AF being defined as the ratio of the moduli of elasticity at 100% elongation of strips measuring 2×15 cm which have been punched from the flexible recording layer during production of the raw plate, on the one hand along the flow direction of the photosensitive mixture used and on the other hand crosswise to the said flow direction and then exposed uniformly, comprising the following steps:
   (1) applying a photosensitive mixture to a dimensionally stable base, said photosensitive mixture consisting essentially of
   A) one or more block copolymers containing at least one thermoplastic non-elastomeric polymer block and at least one elastomeric diene polymer block,
   B) a mixture of
      B1) from 7 to 15% by weight, based on the photosensitive mixture, of one or more photopolymerizable organic compounds which are compatible with (A) and contain one or more olefinic double bonds, and
      B2) from 2 to 8% by weight, based on the photosensitive mixture, of one or more monoolefinically unsaturated organic compounds which are compatible with (A) and whose homopolymers have glass transition temperatures which are below room temperature,
   C) from 0.1 to 10% by weight, based on the photosensitive mixture, of one or more photoinitiators, and
   D) from 0 to 27% by weight, based on the photosensitive mixture, of conventional assistants and additives;
   (2) subjecting the photosensitive mixture on the dimensionally stable base to calendaring and/or lamination to produce a photosensitive recording element comprising a dimensionally stable base and a photosensitive recording layer;
   (3) exposing, imagewise, the photosensitive recording element; and
   (4) developing by washing the exposed recording element with an organic solvent to form a flexographic relief printing plate comprising a dimensionally stable base and a photopolymerized relief layer.

2. The process of claim 1, wherein the photosensitive recording element is preexposed uniformly before imagewise exposure.

3. The process of claim 1, wherein the flexographic printing plate is postexposed uniformly after development.

4. The process of claim 3, wherein the flexographic printing plate is treated with bromine before uniform post exposure.

5. The process of claim 1, wherein the compound (B2) is an ester of acrylic acid and a monoalkanol selected from the group consisting of monoalkanols containing a branched alkyl group of 4 to 16 carbon atoms.

6. The process of claim 1, wherein the compound (B2) is an ester of acrylic acid and monoalkanol selected from the group consisting of monoalkanols containing a straight-chain alkyl group of 6 to 12 carbons.

7. The process of claim 1, wherein the compound (B2) is an amide of acrylic acid an an alkylamine selected from the group consisting of alkylamines where the total number of carbon atoms in the alkyl radical is from 4 to 16.

8. The process of claim 1, wherein the compound (B2) is selected from the group consisting of vinyl alkyl ethers where the total number of carbon atoms in the alkyl radical is from 4 to 18.

9. The process of claim 1, wherein the block copolymer (A) consists of form 5 to 25% by weight of the block copolymer of a polymer block prepared from one or more of the styrene monomers of the formula $CH_2=CRR'$, where R is hydrogen or methyl and R' is phenyl or $C_1$-$C_4$-alkyl-substituted phenyl, and has a glass transition temperature $+25°$ C.; from 15 to 90% by weight of the block copolymer of a polymer block prepared from one or more aliphatic diene hydrocarbons of 4 to 5 carbon atoms and having a glass transition temperature of $-20°$ C.; and from 5 to 60% by weight of the block copolymer of a polymer block prepared by homopolymerization or copolymerization of one or more diene hydrocarbons of 4 or 5 carbon atoms and having a glass transition temperature of from $-30°$ C. to $+15°$ C.

* * * * *